(12) United States Patent
Qian et al.

(10) Patent No.: US 9,843,016 B2
(45) Date of Patent: Dec. 12, 2017

(54) OLED PACKAGE STRUCTURE AND OLED PACKAGING METHOD

(71) Applicant: Shenzhen China Star Optoelectronics Technology Co., Ltd., Shenzhen (CN)

(72) Inventors: Jiajia Qian, Shenzhen (CN); Yawei Liu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/455,085

(22) Filed: Mar. 9, 2017

(65) Prior Publication Data

US 2017/0179421 A1 Jun. 22, 2017

Related U.S. Application Data

(62) Division of application No. 14/758,244, filed on Jun. 29, 2015, now Pat. No. 9,634,282.

(30) Foreign Application Priority Data

Jan. 26, 2015 (CN) .......................... 2015 1 0039439

(51) Int. Cl.
*H01L 21/00* (2006.01)
*H01L 51/52* (2006.01)
*H01L 51/56* (2006.01)

(52) U.S. Cl.
CPC ........ *H01L 51/524* (2013.01); *H01L 51/5259* (2013.01); *H01L 51/56* (2013.01); *H01L 2251/303* (2013.01)

(58) Field of Classification Search
CPC .... H01L 51/56; H01L 51/524; H01L 51/5259
USPC ................................ 438/22, 48, 64; 257/704
See application file for complete search history.

(56) References Cited

U.S. PATENT DOCUMENTS

| 6,818,479 | B2* | 11/2004 | Boroson | ................. | H01L 23/08 |
| | | | | | 257/678 |
| 8,508,036 | B2* | 8/2013 | Honer | ................... | H01L 23/055 |
| | | | | | 257/686 |
| 2003/0057574 | A1* | 3/2003 | Boroson | ................. | H01L 23/08 |
| | | | | | 257/788 |
| 2003/0062186 | A1* | 4/2003 | Boroson | ................. | H01L 23/26 |
| | | | | | 174/533 |
| 2007/0170849 | A1* | 7/2007 | Park | ...................... | H01L 51/524 |
| | | | | | 313/506 |
| 2009/0066243 | A1* | 3/2009 | Sakurai | ................. | H01L 51/524 |
| | | | | | 313/512 |

(Continued)

*Primary Examiner* — Nitin Parekh
(74) *Attorney, Agent, or Firm* — Leong C. Lei

(57) ABSTRACT

An OLED package structure includes a substrate, a package lid arranged opposite to the substrate, an OLED device arranged between the substrate and the package lid and mounted to the substrate, and enclosure resin located between the substrate and the package lid and bonding the substrate and the package lid together. The package lid includes a recess formed therein at a location corresponding to the OLED device. The recess includes therein a plurality of corrugation projection structures arranged therein and extending outwards from a bottom of the recess. Desiccant is attached to the bottom of the recess in an area between two adjacent ones of the corrugation projection structures.

6 Claims, 7 Drawing Sheets

(56) References Cited

U.S. PATENT DOCUMENTS

| | | | |
|---|---|---|---|
| 2013/0049022 A1* | 2/2013 | Farquhar | H01L 51/448 257/88 |
| 2013/0069105 A1* | 3/2013 | Shi | H01L 51/524 257/100 |
| 2014/0175389 A1* | 6/2014 | Xiong | H01L 51/5246 257/40 |

* cited by examiner

US 9,843,016 B2

OLED PACKAGE STRUCTURE AND OLED PACKAGING METHOD

CROSS REFERENCE TO RELATED APPLICATIONS

This application is a divisional application of co-pending U.S. patent application Ser. No. 14/758,244, filed on Jun. 29, 2015, which is a national stage of PCT Application No. PCT/CN2015/075846, filed on Apr. 3, 2015, claiming foreign priority of Chinese Patent Application No. 201510039439.X, filed on Jan. 26, 2015.

BACKGROUND OF THE INVENTION

1. Field of the Invention

The present invention relates to the field of packaging technology, and in particular to an OLED (Organic Light-Emitting Diode) package structure and an OLED packaging method.

2. The Related Arts

OLED stands for organic light emitting diode, which has various advantages, such as being self-luminous, high brightness, wide view angle, high contrast, being flexible, and low power consumption and is considered the new generation of display measures that gradually takes the place of the conventional liquid crystal displays by being widely used in mobile phone screens, computer displays, and full-color televisions. The OLED displaying technology is different from the liquid crystal displaying technology in that no backlighting is needed and an extremely thin coating layer of an organic material and a glass substrate are used in such a way that when an electrical current flows therethrough, the organic material emits light. However, since the organic material is highly reactive to moisture and oxygen, an OLED display, which is a display device based on such an organic material, must require extremely high standard of packaging.

Currently, packaging of an OLED device is generally done with a dam-and-desiccant manner. FIG. 1 is a cross-sectional view showing a conventional OLED package structure. The structure comprises a substrate 100, a package lid 200 opposite to the substrate 100, an OLED device 110 that is arranged between the substrate 100 and the package lid 200 and mounted on the substrate 100, desiccant 210 that is arranged between the substrate 100 and the package lid 200 and mounted to the package lid 200, and enclosure resin 300 that is located between the substrate 100 and the package lid 200 and bonds the substrate 100 and the package lid 200 together. A recess 220 is formed on an inner side of the package lid 200 and corresponds to an outer circumference of the OLED device 110. The desiccant 210 is mounted in the recess 220 to absorb moisture penetrating through the enclosure resin 300 and entering the interior of the OLED in order to enhance the performance of the OLED device and extend the life span of the OLED. However, such an OLED package structure has a large gap existing in the interior thereof, leading to reduced mechanical strength and easy breaking.

Thus, it is desired to provide a novel OLED package structure and an OLED packaging method that overcome the above problems.

SUMMARY OF THE INVENTION

An object of the present invention is to provide an organic light-emitting diode (OLED) package structure, which has a high mechanical strength, good sealing tightness, and extended life span.

Another object of the present invention is to provide an OLED packaging method, which significantly enhances the mechanical strength of a package structure and improves sealing tightness so as to improve the performance of an OLED device and extend the life span of the OLED device.

To achieve the above objects, the present invention provides an OLED package structure, which comprises a substrate, a package lid arranged opposite to the substrate, an OLED device arranged between the substrate and the package lid and mounted to the substrate, and enclosure resin located between the substrate and the package lid and bonding the substrate and the package lid together;

wherein the package lid comprises a recess formed therein at a location corresponding to the OLED device and the recess comprises a plurality of corrugation projection structures arranged therein and extending outwards from a bottom of the recess, wherein desiccant is attached to the bottom of the recess in an area between two adjacent ones of the corrugation projection structures.

The recess has a depth less than or equal to ⅓ of a thickness of the package lid.

The corrugation projection structures have a height less than or equal to the depth of the recess.

The desiccant comprises calcium oxide.

The present invention also provides an OLED package structure, which comprises a substrate, a package lid arranged opposite to the substrate, an OLED device arranged between the substrate and the package lid and mounted to the substrate, and enclosure resin located between the substrate and the package lid and bonding the substrate and the package lid together;

wherein the package lid comprises a recess formed therein at a location corresponding to the OLED device and the recess comprises a plurality of corrugation projection structures arranged therein and extending outwards from a bottom of the recess, wherein desiccant is attached to the bottom of the recess in an area between two adjacent ones of the corrugation projection structures;

wherein the recess has a depth less than or equal to ⅓ of a thickness of the package lid;

wherein the desiccant comprises calcium oxide.

The present invention further provides an organic light-emitting diode (OLED) packaging method, which comprises the following steps:

(1) providing a substrate and a package lid;

(2) forming a recess in the package lid and forming a plurality of corrugation projection structures in the recess to extend outward from a bottom of the recess, wherein the corrugation projection structures are connected to two parallel sidewalls of the recess and are perpendicular to the two sidewalls;

(3) attaching desiccant to the bottom of the recess in an area between two adjacent ones of the corrugation projection structures;

(4) coating enclosure resin on the package lid around and outside a perimeter of the recess;

(5) forming an OLED device on the substrate in an area corresponding to the recess;

(6) laminating the substrate and the package lid together;

(7) applying ultraviolet light to irradiate for curing the enclosure resin so as to complete packaging the substrate with the package lid.

Step (2) applies an acid etching process to form the recess and the corrugation projection structures in the recess.

The recess has a depth less than or equal to ⅓ of a thickness of the package lid.

The corrugation projection structures have a height less than or equal to the depth of the recess.

The desiccant of step (3) comprises calcium oxide.

Step (5) applies a vapor deposition process to form the OLED device.

The efficacy of the present invention is that the present invention provides an OLED package structure, which comprises a recess formed in a package lid and a plurality of corrugation projection structures arranged in the interior of the recess and extending outwards from a bottom of the recess to help significantly improve the performance of the package lid resisting shocks and pressurization so as to provide the OLED package structure of the present invention with an increased mechanical strength and also, desiccant is mounted in the interior of the recess to absorb moisture penetrating through an enclosure resin into the interior of the package structure so as to achieve improved sealing tightness, extended life span, and a simple structure that makes manufacture easy. The present invention provides an OLED packaging method, which has a simple manufacture process and is of high operability.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of an embodiment of the present invention, with reference to the attached drawing.

In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
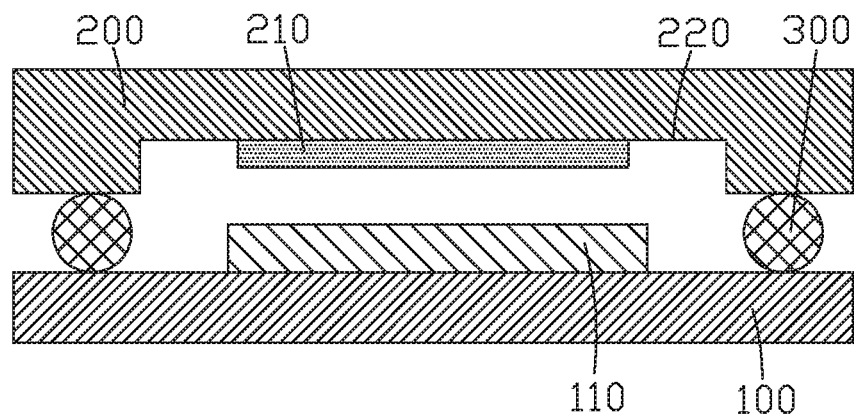
FIG. 1 is a cross-sectional view showing a conventional OLED (Organic Light-Emitting Diode) package structure.
Figure 2:
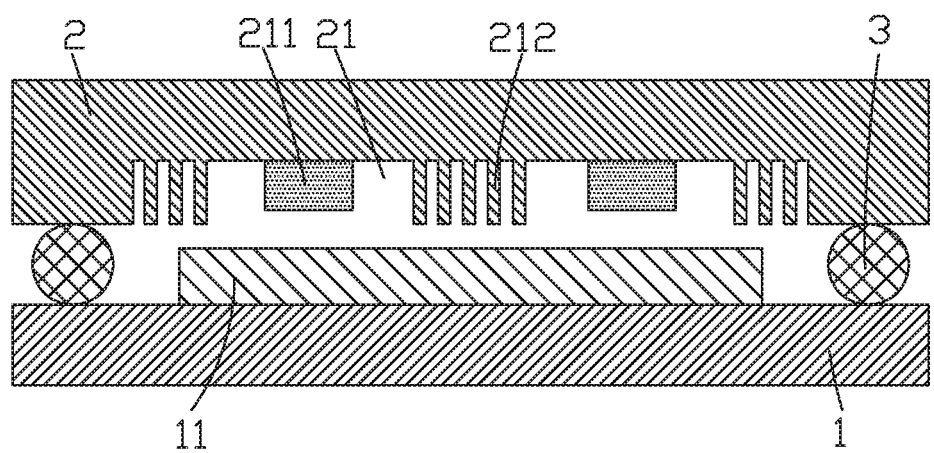
FIG. 2 is a cross-sectional view showing an OLED package structure according to the present invention.
Figure 3:
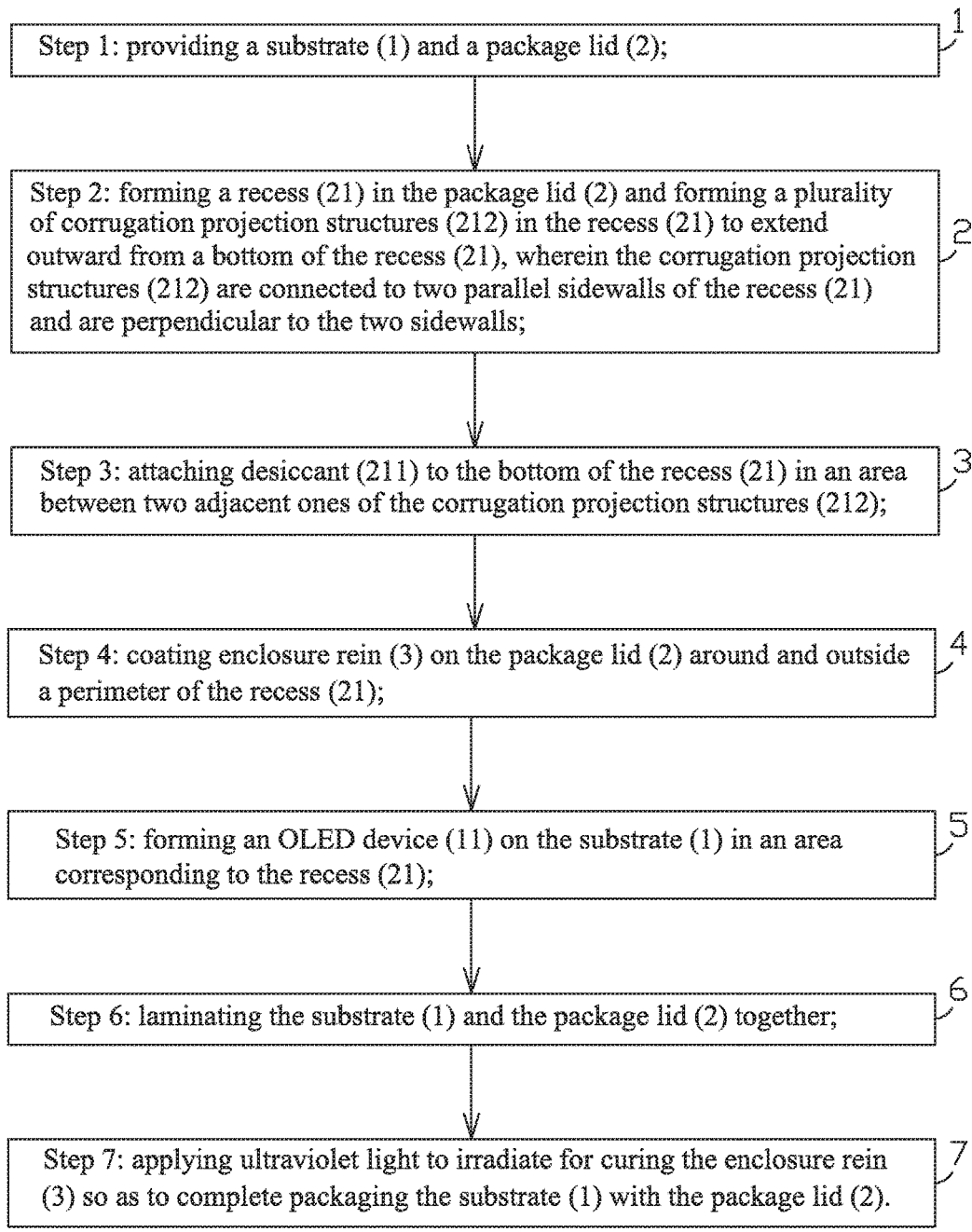
FIG. 3 is a flow chart illustrating an OLED packaging method according to the present invention.

Referring to FIG. 2, the present invention provides an organic light-emitting diode (OLED) package structure, which comprises a substrate 1, a package lid 2 arranged opposite to the substrate 1, an OLED device 11 arranged between the substrate 1 and the package lid 2 and mounted to the substrate 1, and enclosure resin 3 located between the substrate 1 and the package lid 2 and bonding the substrate 1 and the package lid 2 together.

The package lid 2 comprises a recess 21 formed therein at a location corresponding to the OLED device 11. The recess 21 comprises a plurality of corrugation projection structures 212 arranged therein and formed on and extending outwards from a bottom thereof, wherein desiccant 211 is attached to the bottom of the recess 21 in an area between two adjacent ones of the corrugation projection structures 212.

Specifically, the corrugation projection structures 212 are formed to connect to two parallel sidewalls of the recess 21 and are perpendicular to the two sidewalls.

Specifically, the corrugation projection structures 212 each comprise a plurality of projections and a passageway delimited between every two adjacent ones of the projections. Preferably, the substrate 1 and the package lid 2 are both glass boards and the substrate 1 is a thin-film transistor (TFT) substrate.

Specifically, the enclosure resin 3 comprises ultraviolet (UV) curable resin.

Preferably, the recess 21 has a depth that is less than or equal to one third ($1/3$) of a thickness of the package lid 2 and the corrugation projection structures 212 have a height less than or equal to the depth of the recess 21.

The arrangement of the corrugation projection structures 212 significantly increases the performance of the package lid resisting shocks and pressurization and thus providing the OLED package structure of the present invention with an increased mechanical strength.

Preferably, the desiccant 211 comprises calcium oxide, which absorbs moisture penetrating through the enclosure resin 3 and entering the interior of the package structure.

The above-described OLED package structure comprises a package lid in which a recess is formed and a plurality of corrugation projection structures arranged in the recess and formed on and extending outwards from a recess bottom to help significantly improve the performance of the package lid resisting shocks and pressurization so as to provide the OLED package structure of the present invention with an increased mechanical strength and also, desiccant is mounted in the interior of the recess to absorb moisture penetrating through an enclosure resin into the interior of the package structure so as to achieve improved sealing tightness, extended life span, and a simple structure that makes manufacture easy.

Figure 4:
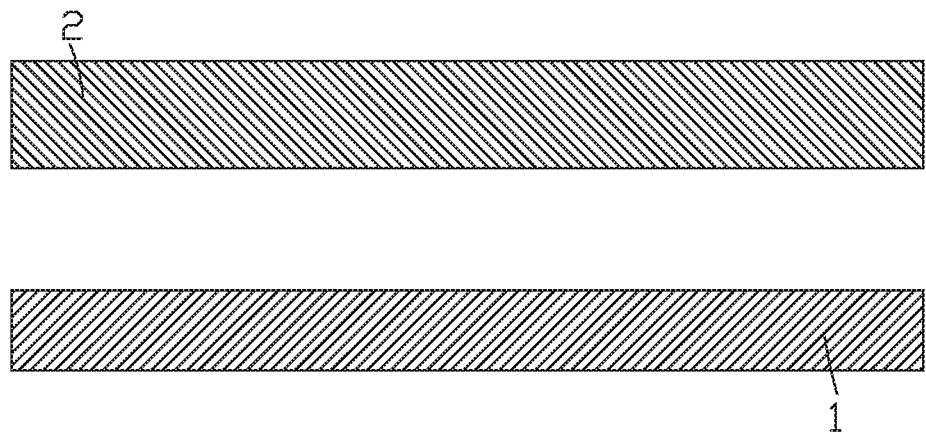
FIG. 4 is a schematic view illustrating step 1 of the OLED packaging method according to the present invention.

Referring to FIGS. 3-12, the present invention also provides an OLED packaging method, which comprises the following steps:

Step 1: as shown in FIG. 4, providing a substrate 1 and a package lid 2.

Preferably, the substrate 1 and the package lid 2 are both glass boards and the substrate 1 is a TFT substrate.

Figure 5:
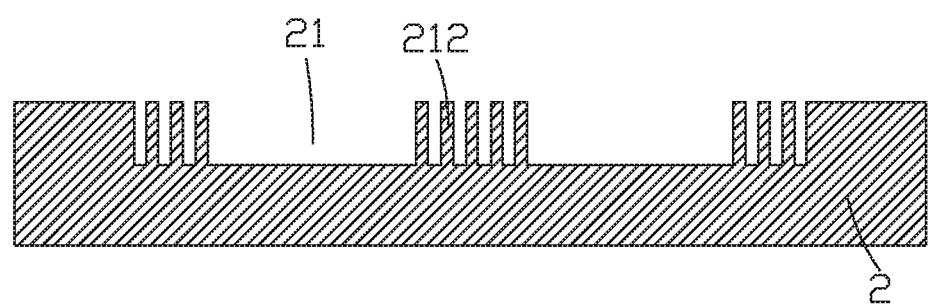
FIG. 5 is a schematic view illustrating step 2 of the OLED packaging method according to the present invention.

Step 2: as shown in FIG. 5, forming a recess 21 in the package lid 2 and forming a plurality of corrugation projection structures 212 in the recess 21 to extend outward from a bottom of the recess 21, wherein the corrugation projection structures 212 are connected to two parallel sidewalls of the recess 21 and are perpendicular to the two sidewalls.

Specifically, the corrugation projection structures 212 each comprise a plurality of projections and a passageway delimited between every two adjacent ones of the projections. The arrangement of the corrugation projection structures 212 significantly increases the performance of the package structure resisting shocks and pressurization and thus providing an increased mechanical strength thereof.

Specifically, the recess 21 and the corrugation projection structure 212 can be formed through an acid etching process.

Preferably, the recess 21 has a depth that is less than or equal to one third (⅓) of a thickness of the package lid 2 and the corrugation projection structures 212 have a height less than or equal to the depth of the recess 21.

Figure 6:
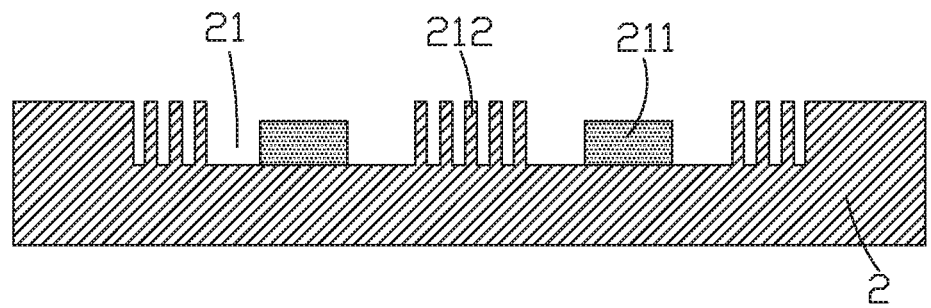
FIG. 6 is a schematic view illustrating step 3 of the OLED packaging method according to the present invention.
Figure 7:
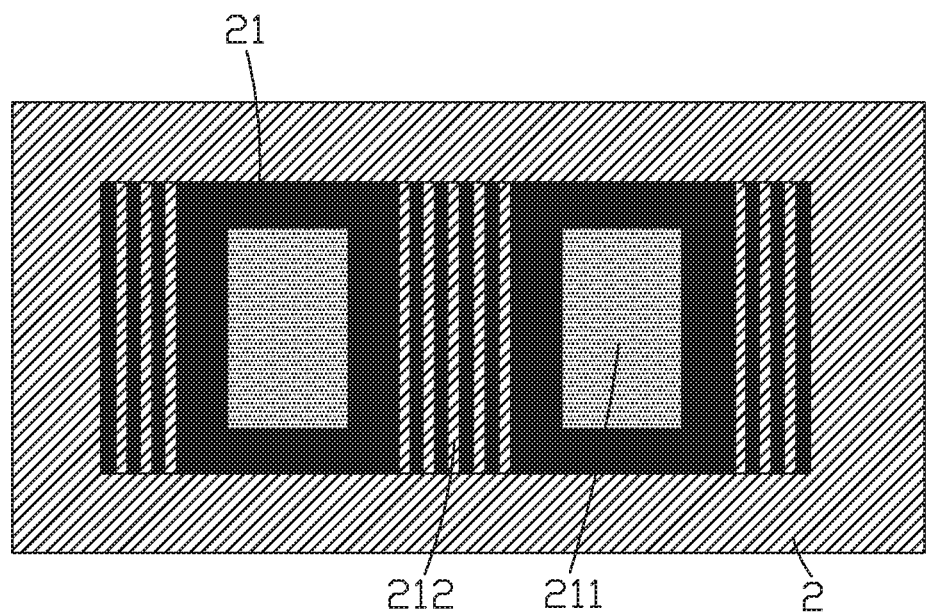
FIG. 7 is a top plan view illustrating step 3 of the OLED packaging method according to the present invention.

Step 3: as shown in FIGS. 6 and 7, attaching desiccant 211 to the bottom of the recess 21 in an area between two adjacent ones of the corrugation projection structures 212.

Preferably, the desiccant 211 comprises calcium oxide, which absorbs moisture penetrating through the enclosure resin 3 and entering the interior of the package structure.

Figure 8:
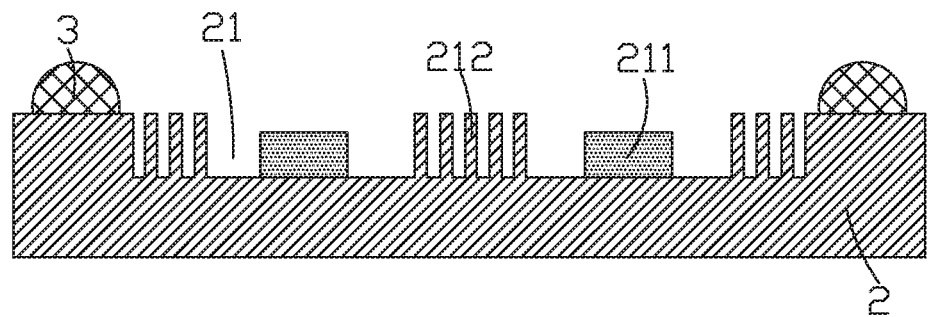
FIG. 8 is a schematic view illustrating step 4 of the OLED packaging method according to the present invention.
Figure 9:
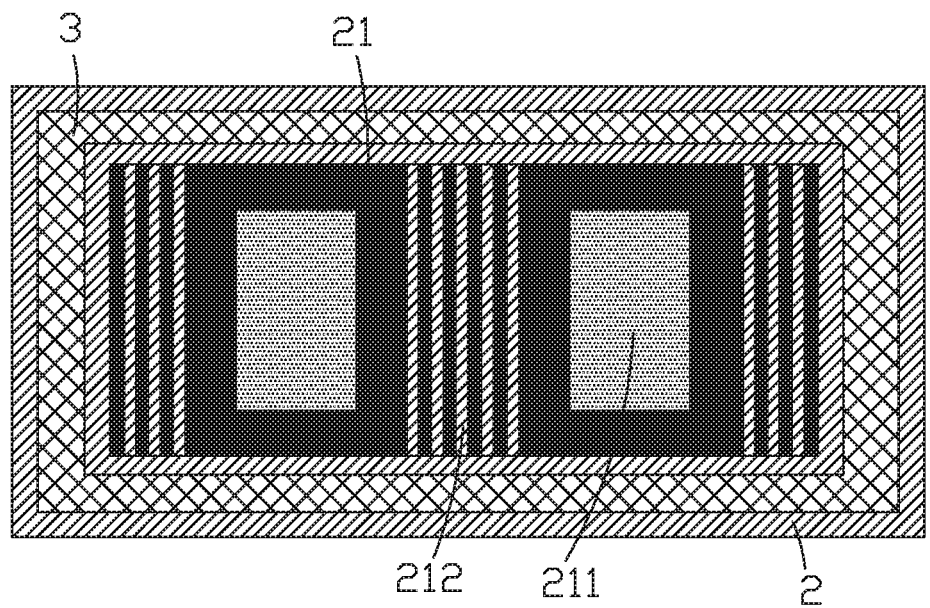
FIG. 9 is a top plan view illustrating step 4 of the OLED packaging method according to the present invention.

Step 4: as shown in FIG. 8-9, coating enclosure resin 3 on the package lid 2 around and outside a perimeter of the recess 21.

Specifically, the enclosure resin 3 comprises UV curable resin.

Figure 10:
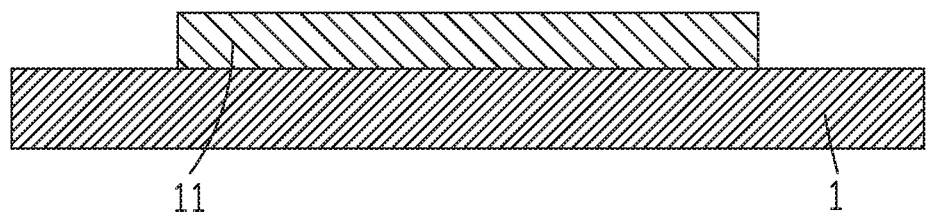
FIG. 10 is a schematic view illustrating step 5 of the OLED packaging method according to the present invention.

Step 5: as shown in FIG. 10, forming an OLED device 11 on the substrate 1 in an area corresponding to the recess 21.

Specifically, the OLED device 11 is formed through a vapor deposition process.

Figure 11:
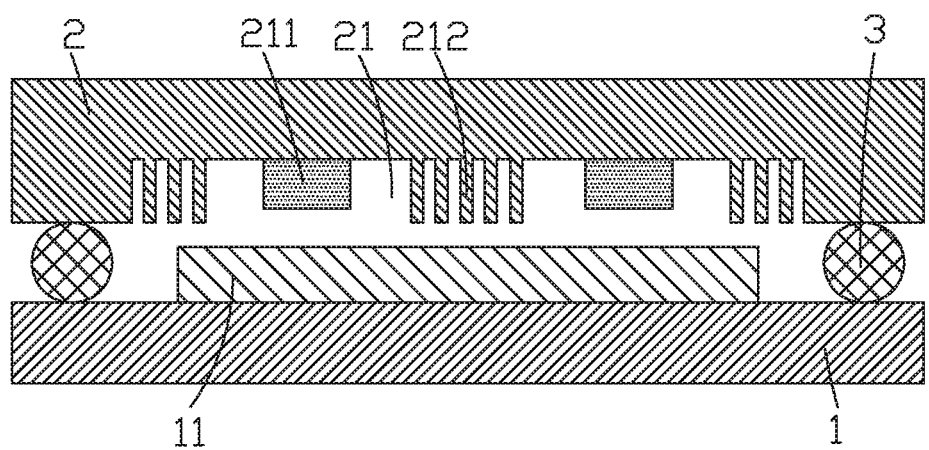
FIG. 11 is a schematic view illustrating step 6 of the OLED packaging method according to the present invention.

Step 6: as shown in FIG. 11, laminating the substrate 1 and the package lid 2 together.

Figure 12:
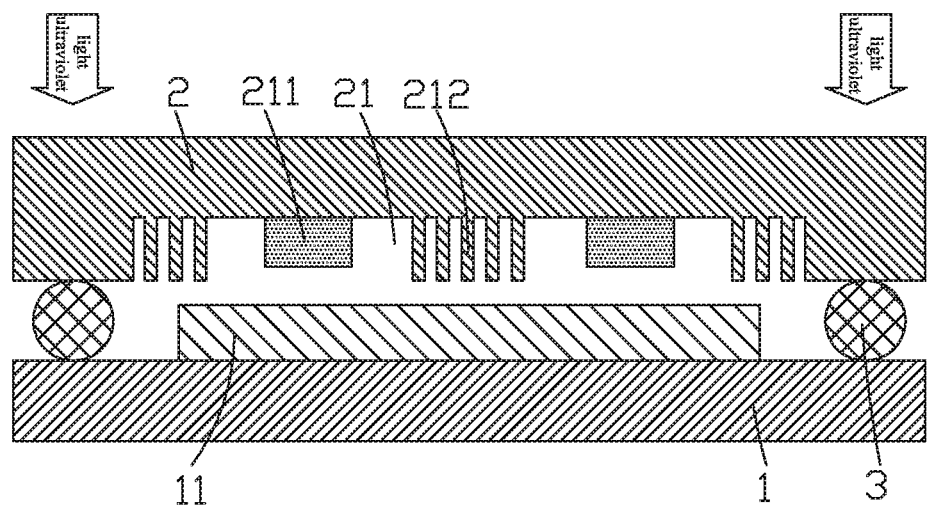
FIG. 12 is a schematic view illustrating step 7 of the OLED packaging method according to the present invention.

Step 7: as shown in FIG. 12, applying ultraviolet light to irradiate for curing the enclosure resin 3 so as to complete packaging the substrate 1 with the package lid 2.

The above-described OLED packaging method comprises forming a recess in a package lid and simultaneously forming a plurality of corrugation projection structures in the recess to extend outwards from a bottom of recess so as to improve the performance of the package lid resisting shocks and pressurization and thus providing the OLED package structure with an improved mechanical strength and also comprises attaching desiccant to the interior of the recess for absorbing moisture penetrating through enclosure resin into the interior of the package structure thereby improving sealing tightness and effectively extending the life span of the OLED device and also providing a simple manufacture process that is of high operability.

In summary, the present invention provides an OLED package structure, which comprises a recess formed in a package lid and a plurality of corrugation projection structures arranged in the interior of the recess and extending outwards from a bottom of the recess to help significantly improve the performance of the package lid resisting shocks and pressurization so as to provide the OLED package structure of the present invention with an increased mechanical strength and also, desiccant is mounted in the interior of the recess to absorb moisture penetrating through an enclosure resin into the interior of the package structure so as to achieve improved sealing tightness, extended life span, and a simple structure that makes manufacture easy. The present invention provides an OLED packaging method, which has a simple manufacture process and is of high operability.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An organic light-emitting diode (OLED) packaging method, comprising the following steps:
    (1) providing a substrate and a package lid;
    (2) forming a recess in the package lid and forming a plurality of corrugation projection structures in the recess to extend outward from a bottom of the recess, wherein the corrugation projection structures are connected to two parallel sidewalls of the recess and are perpendicular to the two sidewalls;
    (3) attaching desiccant to the bottom of the recess in an area between two adjacent ones of the corrugation projection structures;
    (4) coating enclosure resin on the package lid around and outside a perimeter of the recess;
    (5) forming an OLED device on the substrate in an area corresponding to the recess;
    (6) laminating the substrate and the package lid together; and
    (7) applying ultraviolet light to irradiate for curing the enclosure resin so as to complete packaging the substrate with the package lid;
    wherein the plurality of corrugation projection structures comprise:
    a first group of ribs, which are spaced from and parallel to each other;
    a second group of ribs, which are spaced from and parallel to each other, the first and second groups being arranged in the recess and respectively adjacent to and spaced from two opposite side walls of the recess; and
    a third group of ribs arranged in the recess and between the first and second groups of ribs to define first and second accommodation spaces with respect to the first and second groups of ribs, the ribs of the third group being spaced from and parallel to each other,
    wherein the ribs of the first, second, and third groups are parallel to each other and parallel to the two side walls of the recess, and the desiccant is arranged in each of the accommodation spaces.

2. The OLED packaging method as claimed in claim 1, wherein step (2) applies an acid etching process to form the recess and the corrugation projection structures in the recess.

3. The OLED packaging method as claimed in claim 1, wherein the recess has a depth less than or equal to ⅓ of a thickness of the package lid.

4. The OLED packaging method as claimed in claim 3, wherein the corrugation projection structures have a height less than or equal to the depth of the recess.

5. The OLED packaging method as claimed in claim 1, wherein the desiccant of step (3) comprises calcium oxide.

6. The OLED packaging method as claimed in claim 1, wherein in step (5), a vapor deposition process is applied to form the OLED device.

* * * * *